(12) United States Patent
Kanev et al.

(10) Patent No.: US 7,659,743 B2
(45) Date of Patent: Feb. 9, 2010

(54) METHOD AND APPARATUS FOR TESTING ELECTRONIC COMPONENTS WITHIN HORIZONTAL AND VERTICAL BOUNDARY LINES OF A WAFER

(75) Inventors: Stojan Kanev, Thiendorf OT Sacka (DE); Jörg Kiesewetter, Thiendorf OT Sacka (DE)

(73) Assignee: SUSS MicroTec Test Systems GmbH, Saka (DE)

( * ) Notice: Subject to any disclaimer, the term of this patent is extended or adjusted under 35 U.S.C. 154(b) by 0 days.

(21) Appl. No.: 11/947,206

(22) Filed: Nov. 29, 2007

(65) Prior Publication Data
US 2008/0180119 A1 Jul. 31, 2008

(30) Foreign Application Priority Data
Jan. 29, 2007 (DE) .................. 10 2007 005 208

(51) Int. Cl.
*G01R 31/02* (2006.01)
(52) U.S. Cl. ..................... 324/765; 324/158.1
(58) Field of Classification Search ........................ None
See application file for complete search history.

(56) References Cited
U.S. PATENT DOCUMENTS

| | | | | | |
|---|---|---|---|---|---|
| 3,437,929 | A | * | 4/1969 | Glenn ......................... | 324/759 |
| 3,781,683 | A | * | 12/1973 | Freed ......................... | 324/765 |
| 4,703,252 | A | * | 10/1987 | Perloff et al. ................ | 324/758 |
| 5,642,298 | A | * | 6/1997 | Mallory et al. .............. | 702/117 |
| 5,670,888 | A | * | 9/1997 | Cheng ......................... | 324/754 |
| 6,634,245 | B1 | * | 10/2003 | Yoshioka et al. ........... | 73/865.8 |
| 6,828,772 | B1 | * | 12/2004 | Hofer et al. ............... | 324/158.1 |
| 7,396,022 | B1 | * | 7/2008 | Moghadam et al. ............ | 279/3 |

* cited by examiner

*Primary Examiner*—Vinh P Nguyen
(74) *Attorney, Agent, or Firm*—Heslin Rothenberg Farley & Mesiti P.C.

(57) ABSTRACT

A method and an apparatus are provided which make it possible, when testing chips arranged on a wafer, to be able to test optionally both additional components arranged on horizontal boundary lines and on vertical boundary lines. The additional components arranged on horizontal boundary lines are tested in a first position of the wafer. For testing the additional components arranged on vertical boundary lines, the wafer is rotated about its vertical axis through 90° relative to the first position into a second position. The apparatus comprises a housing and, in the housing, at least one test probe for making contact with an electronic component, a chuck for moving the wafer and a rotatably mounted additional plate operatively connected to the chuck.

7 Claims, 2 Drawing Sheets

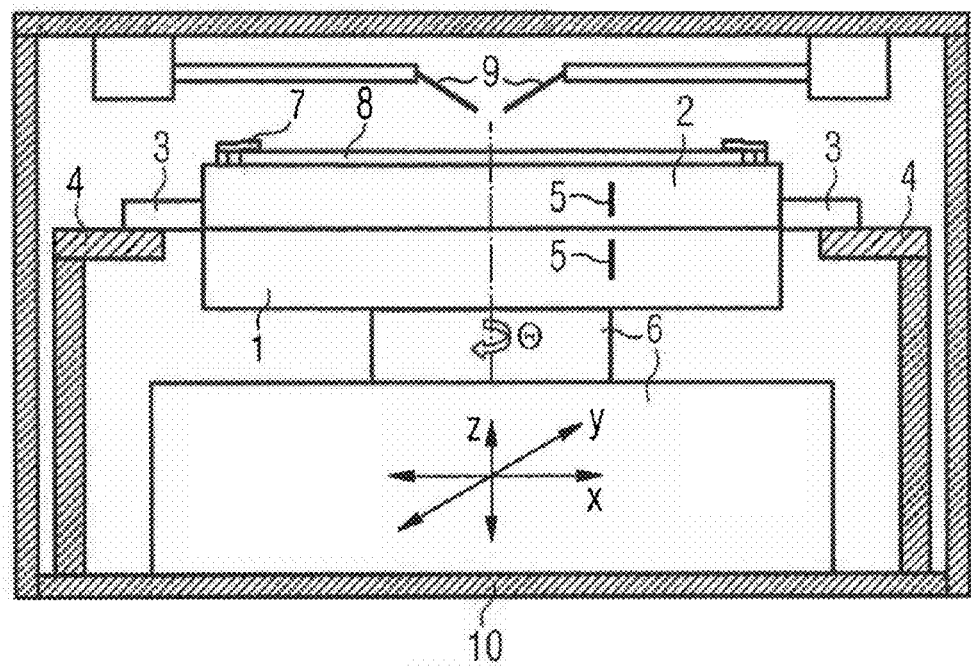
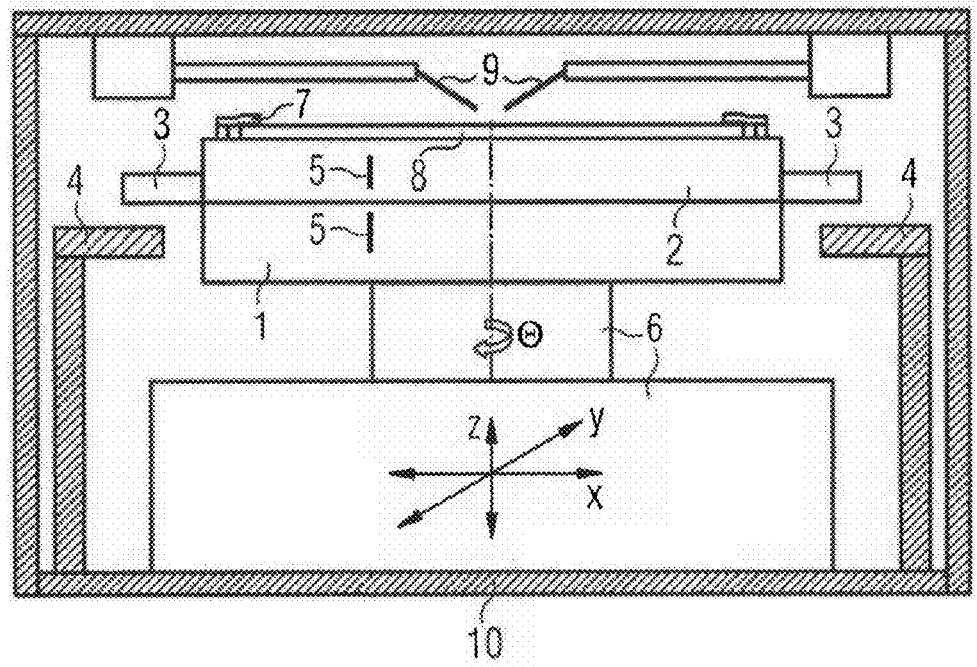

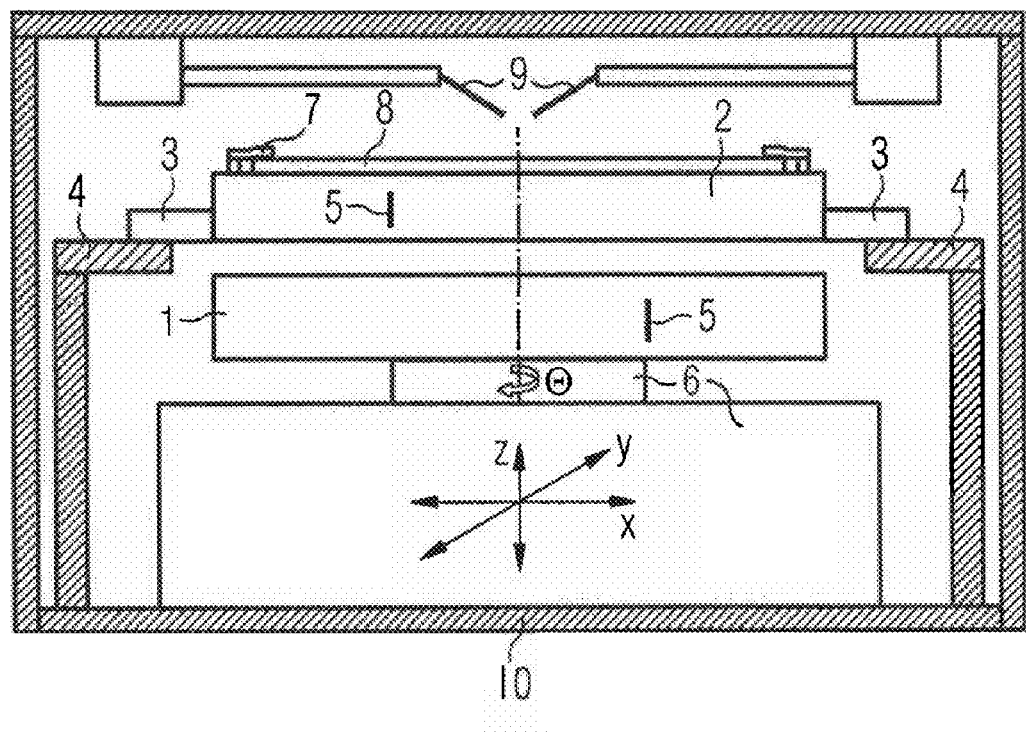

METHOD AND APPARATUS FOR TESTING ELECTRONIC COMPONENTS WITHIN HORIZONTAL AND VERTICAL BOUNDARY LINES OF A WAFER

CROSS REFERENCE TO RELATED APPLICATIONS

This application claims priority of German application No. 10 2007 005 208.3 filed on Jan. 29, 2007, the entire disclosure of which is hereby incorporated herein by reference.

BACKGROUND ART

The invention relates to a method for testing electronic components in a test apparatus (prober), and to a test apparatus for carrying out the method.

During the production of semiconductor components, firstly a multiplicity of chips are structured on a wafer composed of semiconductor material. Since the chips are generally rectangular, they are arranged in rows and columns on the wafer, such that the chips in each row and in each column have a common boundary line (also referred to as scribe lines or streets) with respect to each adjacent row and column, respectively. Before the chips of the wafer are singulated to form dies, they are subjected to various tests in a prober.

The singulation of the chips to form dies is effected either in a "dicing before grinding" process, in which on the wafer firstly scribing trenches are produced in a sawing process along the boundary lines of all the rows and columns of chips, the depth of said trenches being smaller than the thickness of the wafer, and then the remaining material of the wafer is ground away from the opposite side of the wafer to the scribing trenches, or in a "grinding before dicing" process, in which the wafer is firstly ground away from the passive side down to the desired thickness and then the wafer is sawn through along the boundary lines of all the rows and columns of chips.

In the arrangement of the chips on the wafer, the width of the sawing tool is taken into account, that is to say that the distance between two adjacent chips is chosen to be at least as large as the width of the sawing tool, since the wafer material removed in the sawing process is lost. In other words, the expression boundary line, as used hereinafter, denotes a material strip of finite width arranged between two adjacent chips.

It is known to structure additional components, for example transistors that are typical of the chips arranged on the wafer, on the lost material of the boundary lines and likewise to subject said components to specific tests in the course of the testing of the chips still arranged in the wafer assembly, for example in order to obtain statements about the process state for monitoring purposes. Further applications of the additional components relate to experiments with regard to further design possibilities (device characterization and modelling) and also reliability tests. Whereas in general only the horizontal boundary lines, that is to say the material strips situated between each two rows of chips, have been used hitherto for the additional components, the increased demand for information obtained at said additional components requires the vertical boundary lines, that is to say the material strips situated between each two columns of chips, also to be used as far as possible for the structuring of additional components.

If both the horizontal and the vertical boundary lines are used for the structuring of additional components, it must also be ensured that the additional components can be tested, that is to say that the additional components can be contact-connected by the test probes of a prober used for the testing. Within the prober, the wafer for carrying out the tests is deposited and fixed on a wafer holder, a so-called chuck. Such chucks usually have a drive that enables a translational movement of the wafer receptacle in all three spatial directions and rotational movement about the vertical axis, but the rotation is restricted to a few degrees.

Proceeding from this prior art it is an object of the present invention to specify a method and an apparatus which make it possible to be able to test optionally both the additional components arranged on horizontal boundary lines and the additional components arranged on vertical boundary lines.

BRIEF SUMMARY OF INVENTION

The method according to the invention for testing electronic components, in which, besides the testing of the chips arranged on a wafer, additional components arranged between the chips are also tested, wherein the additional components arranged on horizontal boundary lines are tested in a first position of the wafer, is characterized in that the wafer, for testing the additional components arranged on vertical boundary lines, is rotated about its vertical axis through 90° relative to the first position into a second position.

The method makes it possible for the wafer to be able to be rotated back and forth through at least 90° within the prober, and thus facilitates the testing of the additional components arranged between the chips. As a result, it is possible to utilize the area of the wafer significantly more effectively since additional components structured on horizontal boundary lines can also be tested.

In accordance with a first configuration, it may be provided that the rotation through 90° is effected in a single step. This would however, necessitate configuring the chuck in such a way that it would be able to carry out such a large rotational movement. Since this would be associated with additional costs, it may alternatively be provided that the rotation of the wafer is effected in a plurality of steps, wherein the wafer is raised during each step and lowered between two respective steps. In this way it is possible to carry out the rotation of the wafer using a conventional chuck.

The apparatus described below is proposed for carrying out the method:

The apparatus according to the invention for testing electronic components comprises a housing and, in the housing, at least one test probe for making contact with an electronic component, and also a chuck for moving the wafer and is characterized in that a rotatably mounted additional plate that is operatively connected to the chuck is furthermore provided. In this case, the additional plate is configured in such a way that, in interaction with the chuck, it enables a rotation of the wafer through 90° even if the chuck itself is only able to realize smaller rotational movements.

A first configuration provides for the additional plate to have a drive device, by means of which the additional plate can be rotated about its vertical axis The combined rotational movement of the chuck and of the additional plate makes it possible to realize larger rotational angles than would be possible with a conventional chuck alone.

This first configuration of the apparatus according to the invention can be developed by the additional plate being arranged on the chuck and having fixing means for fixing a wafer on the surface of the additional plate. This solution is appropriate in particular for retrofitting already existing probers, by mounting the additional plate on the top side of the chuck arranged in the housing.

Another development of the first configuration of the apparatus according to the invention provides, by contrast, for the additional plate to be arranged below the chuck and to be fixedly connected to the latter, such that a rotation of the additional plate brings about a rotation of the chuck. This solution has the advantage that the additional plate itself does not have to have fixing means for fixing the wafer, since the corresponding fixing means of the chuck can continue to be used for this.

In a second configuration of the apparatus according to the invention, it is provided that a bracket surrounding the chuck is furthermore provided in the housing, wherein the additional plate bears on the chuck in a raised position of the chuck and bears on the bracket in a lowered position of the chuck. This configuration has the advantage that the additional plate can be configured very simply and does not have to have a dedicated drive device.

In this solution, the rotation of the wafer can be effected step by step by the additional plate being raised by the chuck arranged underneath, being rotated through the angle that can be realized by the chuck, and subsequently being lowered by lowering the chuck on the bracket. The chuck is subsequently rotated back in the lowered position again. The next step begins with the renewed raising of the chuck, during which the additional plate is lifted off from the bracket again.

In the case of the described solution of an additional plate that can be placed onto a bracket, the additional plate may for example have a bearing collar, with which the additional plate bears on the bracket in the lowered position of the chuck.

BRIEF DESCRIPTION OF THE DRAWING FIGURES

The invention is explained in more detail below on the basis of an exemplary embodiment and associated drawings. In this case, FIGS. 1 to 3 show in an apparatus according to the invention the arrangement of a housing, a chuck, a bracket surrounding the chuck, and an additional plate, which bears on the chuck in a raised position of the chuck and bears on the bracket in a lowered position of the chuck. The additional plate is rotated step by step in interaction with the chuck and the bracket. Each of FIGS. 1 to 3 illustrates a phase of a step of the rotary movement, as is explained below.

DETAILED DESCRIPTION

In FIG. 1, the additional plate 2 bears by a bearing collar 3 on the bracket 4, which encloses the chuck 1 and is arranged fixedly relative to the housing 10. As shown, at least one test probe 9 is provided within the housing 10 for making contact with an electronic component on a wafer 8. Wafer 8 is disposed on an additional plate 2, and is fixed relative thereto by fixing means 7. A drive device 6 is provided to rotate chuck 1, and hence, additional plate 2 about its vertical axis. The chuck 1, which is embodied such that it is horizontally and vertically movable and can be rotated about its vertical axis through a few degrees, is situated between a lowered position and a raised position, namely in a position in which the top side of the chuck 1 and the underside of the additional plate 2 touch one another without the bearing collar 3 of the additional plate 2 being lifted off from the bracket 4. The chuck 1 and the additional plate 2 are provided with a respective marking 5 at the same location, said markings serving for illustrating the rotary movement of chuck 1 and additional plate 2 in the further figures.

In FIG. 2, the chuck 1 is situated in the raised position, in which the additional plate 2 is lifted off from the bracket 4 and bears on the chuck 1, and is rotated through the angle that can be realized by the drive device of the chuck 1. The markings 5 of chuck 1 and additional plate 2 have not yet moved relative to one another since the additional plate 2 was carried along during the rotary movement of the chuck 1.

In FIG. 3, the chuck 1 is situated in the lowered position, in which the additional plate 2 bears by the bearing collar 3 on the bracket 4 and there is no contact between chuck 1 and additional plate 2, and is rotated back into its starting position again. In this case, the markings 5 of chuck 1 and additional plate 2 have shifted relative to one another since the additional plate 2 was not carried along during the rotary movement of the chuck 1. This concludes the first step of the rotary movement of the wafer (not illustrated) which bears on the surface of the additional plate 2 and is fixed there. The next step begins again with the additional plate 2 being lifted off from the bracket 4 by raising of the chuck 1, and the chuck 1 then being rotated with the additional plate 2 bearing thereon. By multiply repeating these steps with the chuck 1 subsequently being rotated back in the lowered position, a rotation of the wafer through 90° is finally achieved, thereby enabling contact to be made with the additional components arranged on vertical boundary lines by test probes (not illustrated in the figures).

The invention claimed is:

1. A method for testing electronic components on a wafer, the method comprising:
   providing a chuck and an additional plate operatively coupled thereto for rotating the wafer about its vertical axis through 90° relative to a first position into a second position, wherein without the operatively coupled additional plate, the chuck is rotatable less than 90° only;
   testing electronic components arranged on one of horizontal boundary lines or vertical boundary lines in the first position of the wafer;
   rotating the wafer about its vertical axis through 90° relative to the first position into a second position; and
   testing additional electronic components arranged on the other of the horizontal boundary lines and the vertical boundary lines of the wafer.

2. The method according to claim 1, wherein the rotation of the wafer is effected in a plurality of steps, wherein the wafer is raised during each step and lowered between two respective steps.

3. An apparatus for testing electronic components on a wafer, comprising:
   at least one test probe adapted to make contact with and test an electronic component arranged in one of a horizontal boundary line or a vertical boundary line of the wafer in a first position of the wafer;
   a chuck and an additional plate operatively coupled thereto for rotating the wafer about its vertical axis through 90° relative to the first position into a second position, wherein without the operatively coupled additional plate, the chuck is rotatable less than 90° only:
   wherein the at least one test probe is adapted to make contact with and test an additional component arranged on the other of the horizontal boundary line and the vertical boundary line of the wafer when the wafer is in the second position.

4. The apparatus according to claim 3, wherein the additional plate has a drive device for rotating the additional plate about a vertical axis of the additional plate.

5. The apparatus according to claim 4, wherein the additional plate is arranged on the chuck and has fixing means for fixing the wafer on a surface of the additional plate.

6. The apparatus according to claim 3, wherein a bracket surrounds the chuck, and wherein the additional plate bears on the chuck in a raised position of the chuck and bears on the bracket in a lowered position of the chuck.

7. The apparatus according to claim 6, wherein the additional plate has a bearing collar, with which the additional plate bears on the bracket in the lowered position of the chuck.

* * * * *